(12) United States Patent
Choi et al.

(10) Patent No.: US 12,446,416 B2
(45) Date of Patent: Oct. 14, 2025

(54) ORGANIC LIGHT-EMITTING DIODE DISPLAY APPARATUS INCLUDING FIRST AND SECOND INITIALIZATION CONNECTION LINES MAINTAINING INITIALIZATION VOLTAGES

(71) Applicant: SAMSUNG DISPLAY CO., LTD., Yongin-si (KR)

(72) Inventors: Junwon Choi, Yongin-si (KR); Jaesic Lee, Yongin-si (KR); Jaewon Kim, Yongin-si (KR); Junyoung Min, Yongin-si (KR); Jinhee Jang, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 106 days.

(21) Appl. No.: 17/186,865

(22) Filed: Feb. 26, 2021

(65) Prior Publication Data

US 2022/0059637 A1 Feb. 24, 2022

(30) Foreign Application Priority Data

Aug. 24, 2020 (KR) ........................ 10-2020-0106356

(51) Int. Cl.
*H10K 59/131* (2023.01)
*H10K 59/121* (2023.01)

(52) U.S. Cl.
CPC ....... *H10K 59/131* (2023.02); *H10K 59/1213* (2023.02)

(58) Field of Classification Search
CPC .......... G09G 3/30; G09G 3/32; G09G 3/3208; G09G 3/3216; G09G 3/3222;
(Continued)

(56) References Cited

U.S. PATENT DOCUMENTS 10,777,628 B2    9/2020  Kim et al.
11,176,883 B2 *  11/2021 Na ........................ G09G 3/3291
(Continued)

FOREIGN PATENT DOCUMENTS

CN    110335564 A    10/2019
CN    110706651 A    1/2020
(Continued)

OTHER PUBLICATIONS

Chinese Office Action mailed Jun. 6, 2025 in CN Patent Application No. 202110662059.7, 6 pages.

*Primary Examiner* — Ke Xiao
*Assistant Examiner* — Nelson Lam
(74) *Attorney, Agent, or Firm* — CANTOR COLBURN LLP

(57) ABSTRACT

A display apparatus includes first initialization voltage lines extending in a first direction, second initialization voltage lines extending in the first direction, first initialization connection lines extending in a second direction intersecting the first direction and electrically connecting the first initialization voltage lines to each other, second initialization connection lines extending in the second direction and electrically connecting the second initialization voltage lines to each other, and pixels connected to the first initialization voltage lines, the second initialization voltage lines, the first initialization connection lines and the second initialization connection lines.

27 Claims, 10 Drawing Sheets

(58) Field of Classification Search
CPC .. G09G 3/3225; G09G 3/3258; G09G 3/3266;
G09G 3/3274; G09G 3/3233; G09G
3/3241; G09G 3/3275; G09G 3/3283;
G09G 3/3291; H01L 27/3258; H01L
27/3276; H01L 27/3288; H10K 59/1213;
H10K 59/123; H10K 59/125; H10K
59/131
USPC ..................................................... 345/76–83
See application file for complete search history.

(56) References Cited

U.S. PATENT DOCUMENTS

| | | | | |
|---|---|---|---|---|
| 12,127,448 B2* | 10/2024 | Choi | ............... | H10K 59/131 |
| 2012/0026144 A1* | 2/2012 | Kang | ............... | H01L 27/3276 |
| | | | | 345/76 |
| 2012/0127220 A1* | 5/2012 | Noguchi | ............ | G09G 3/3233 |
| | | | | 345/77 |
| 2012/0286659 A1* | 11/2012 | Kubota | ............ | H01L 27/3279 |
| | | | | 315/51 |
| 2014/0111563 A1* | 4/2014 | Hwang | ............... | G09G 3/003 |
| | | | | 345/691 |
| 2014/0184579 A1* | 7/2014 | Kim | .................... | G09G 3/3208 |
| | | | | 345/82 |
| 2015/0015468 A1* | 1/2015 | Ko | ...................... | G09G 3/3233 |
| | | | | 345/82 |
| 2015/0116295 A1* | 4/2015 | Pyon | ................... | G09G 3/3266 |
| | | | | 345/80 |
| 2015/0356920 A1* | 12/2015 | Na | ....................... | G09G 3/3233 |
| | | | | 345/82 |
| 2016/0103649 A1 | 4/2016 | Yoshitani et al. | | |
| 2016/0125809 A1* | 5/2016 | Hwang | ............... | G09G 3/3258 |
| | | | | 345/212 |
| 2017/0365647 A1 | 12/2017 | Choi et al. | | |
| 2020/0044009 A1 | 2/2020 | Kwak et al. | | |
| 2020/0105849 A1 | 4/2020 | Kim et al. | | |
| 2020/0168147 A1* | 5/2020 | Na | ....................... | G09G 3/3291 |
| 2020/0176542 A1 | 6/2020 | Park et al. | | |
| 2020/0321428 A1 | 10/2020 | An et al. | | |
| 2023/0335056 A1* | 10/2023 | Cho | .................... | G09G 3/3266 |

FOREIGN PATENT DOCUMENTS

| | | |
|---|---|---|
| KR | 1020140085158 A | 7/2014 |
| KR | 1020160052943 A | 5/2016 |
| KR | 1020180004382 A | 1/2018 |
| KR | 1020180072440 A | 6/2018 |
| KR | 1020180079512 A | 7/2018 |
| KR | 1020200016425 A | 2/2020 |
| KR | 1020200037027 A | 4/2020 |
| KR | 1020200066501 A | 6/2020 |
| WO | 2016055897 A1 | 4/2016 |

* cited by examiner

ORGANIC LIGHT-EMITTING DIODE DISPLAY APPARATUS INCLUDING FIRST AND SECOND INITIALIZATION CONNECTION LINES MAINTAINING INITIALIZATION VOLTAGES

This application claims priority to Korean Patent Application No. 10-2020-0106356, filed on Aug. 24, 2020, and all the benefits accruing therefrom under 35 U.S.C. § 119, the content of which in its entirety is herein incorporated by reference.

BACKGROUND

1. Fuel

One or more embodiments relate to a display apparatus, and more particularly, to a display apparatus capable of displaying a high-quality image.

2. Description of Related Art

In general, a display apparatus includes a plurality of pixels, and each of the plurality of pixels includes a display device and a pixel circuit for controlling the display device. The pixel circuit typically includes a thin-film transistor ("TFT"), a storage capacitor, and wirings.

Recently, the number of TFTs used in a display apparatus has increased to accurately control the timing and degree of light emission. Also, the number of pixels has also increased to display an image having a high resolution.

SUMMARY

However, display apparatuses in the related art have problems in that high-quality images are not easily displayed.

Embodiments relate to a display apparatus capable of displaying a high-quality image. According to an embodiment, a display apparatus includes first initialization voltage lines extending in a first direction, second initialization voltage lines extending in the first direction, first initialization connection lines extending in a second direction intersecting the first direction, where the first initialization connection lines electrically connect the first initialization voltage lines to each other, second initialization connection lines extending in the second direction, where the second initialization connection lines electrically connect the second initialization voltage lines to each other, and pixels connected to the first initialization voltage lines and the second initialization voltage lines.

In an embodiment, each of the pixels may include an organic light-emitting diode, a first transistor which controls, in response to a voltage applied to a first node, an amount of current flowing from a second node electrically connected to a power supply voltage line to the organic light-emitting diode, a fourth transistor connected between the first node and the first initialization voltage line, where the fourth transistor may initialize a voltage of a first gate electrode of the first transistor in response to a voltage applied to a fourth gate electrode, and a seventh transistor connected between the second initialization voltage line and a third node between the first transistor and the organic light-emitting diode, where the seventh transistor may initialize a voltage of a pixel electrode of the organic light-emitting diode in response to a voltage applied to a seventh gate electrode.

In an embodiment, the first initialization connection lines and the second initialization voltage lines may pass through each of the pixels.

In an embodiment, the first initialization connection lines may be arranged in one of even-numbered columns and odd-numbered columns of the pixels, and the second initialization connection lines may be arranged in the other of the even-numbered columns and the odd-numbered columns of the pixels.

In an embodiment, the first initialization connection lines may be arranged in every m columns of the pixels, where m is a natural number greater than 1.

In an embodiment, the second initialization connection lines may be arranged between the first initialization connection lines.

In an embodiment, the first initialization connection lines and the second initialization connection lines may be arranged alternately with each other in the first direction.

In an embodiment, a first group of the pixels through which the first initialization connection line passes may be electrically connected to the first initialization voltage line by the first initialization connection line, where the display apparatus further includes first auxiliary initialization connection lines located in a second group of the pixels through which the first initialization connection line does not pass, where the first auxiliary initialization connection lines may be electrically connected to the first initialization voltage line.

In an embodiment, a third group of the pixels through which the second initialization connection line passes may be electrically connected to the second initialization voltage line by the second initialization connection line, where the display apparatus further includes second auxiliary initialization connection lines located in a fourth group of the pixels through which the second initialization connection line does not pass, where the second auxiliary initialization connection lines may be electrically connected to the second initialization voltage line.

In an embodiment, the display apparatus may further include data lines extending in the first direction, where the first initialization connection lines and the second initialization connection lines may be disposed in a same layer as the data lines.

In an embodiment, the first initialization connection lines and the second initialization connection lines may include a same material as a material included in the data lines.

In an embodiment, the first initialization voltage lines and the second initialization voltage lines may be disposed under the first initialization connection lines.

In an embodiment, the display apparatus may further include power supply voltage lines extending in the first direction, where the first initialization connection lines and the second initialization connection lines are disposed in a same layer as the power supply voltage lines.

In an embodiment, the first initialization connection lines and the second initialization connection lines may include a same material as a material included in the power supply voltage lines.

In an embodiment, the first initialization voltage lines and the second initialization voltage lines may be disposed under the first initialization connection lines.

In an embodiment, the display apparatus may further include a substrate, where a through-hole may be defined through a top surface and a bottom surface of the substrate, and the pixels may be located outside the through-hole of the substrate.

According an embodiment, a display apparatus includes a substrate, first initialization voltage lines and second initialization voltage lines disposed on the substrate and extending in a first direction, first initialization connection lines disposed on an interlayer insulating layer covering the first initialization voltage lines and the second initialization voltage lines, where the first initialization connection lines extend in a second direction intersecting the first direction, and electrically connect the first initialization voltage lines to each other through contact holes defined in the interlayer insulating layer, second initialization connection lines disposed on the interlayer insulating layer, where the second initialization connection lines extend in the second direction, and electrically connect the second initialization voltage lines to each other through contact holes defined in the interlayer insulating layer, and organic light-emitting diodes disposed on a planarization layer covering the first initialization connection lines and the second initialization connection lines.

In an embodiment, the first initialization connection lines and the second initialization connection lines may pass through each of the organic light-emitting diodes.

In an embodiment, the first initialization connection lines may be arranged in one of even-numbered columns and odd-numbered columns of the organic light-emitting diodes, and the second initialization connection lines may be arranged in the other of the even-numbered columns and the odd-numbered columns of the organic light-emitting diodes.

In an embodiment, the first initialization connection lines may be arranged in every m columns of the organic light-emitting diodes, where m is a natural number greater than 1.

In an embodiment, the second initialization connection lines may be arranged between the first initialization connection lines.

In an embodiment, the first initialization connection lines and the second initialization connection lines may be arranged alternately with each other in the first direction.

In an embodiment, a first group of the organic light-emitting diodes through which the first initialization connection line passes may be electrically connected to the first initialization voltage line by the first initialization connection line, where the display apparatus further includes first auxiliary initialization connection lines located in a second group of the organic light-emitting diodes through which the first initialization connection line does not pass, where the first auxiliary initialization connection lines may be electrically connected to the first initialization voltage line.

In an embodiment, a third group of the organic light-emitting diodes through which the second initialization connection line passes may be electrically connected to the second initialization voltage line by the second initialization connection line, where the display apparatus further includes second auxiliary initialization connection lines located in a fourth group of the organic light-emitting diodes through which the second initialization connection line does not pass, where the second auxiliary initialization connection lines may be electrically connected to the second initialization voltage line.

In an embodiment, the display apparatus may further include data lines disposed on the interlayer insulating layer and extending in the first direction.

In an embodiment, the first initialization connection lines and the second initialization connection lines may include a same material as a material included in the data lines.

In an embodiment, the display apparatus may further include power supply voltage lines disposed on the interlayer insulating layer and extending in the first direction.

In an embodiment, the first initialization connection lines and the second initialization connection lines may include a same material as a material included in the power supply voltage lines.

In an embodiment, a through-hole may be defined through a top surface and a bottom surface of the substrate, and the organic light-emitting diodes may be located outside the through-hole of the substrate.

BRIEF DESCRIPTION OF THE DRAWINGS

The above and other features of certain embodiments will be more apparent from the following description taken in conjunction with the accompanying drawings, in which.

DETAILED DESCRIPTION

Figure 1:
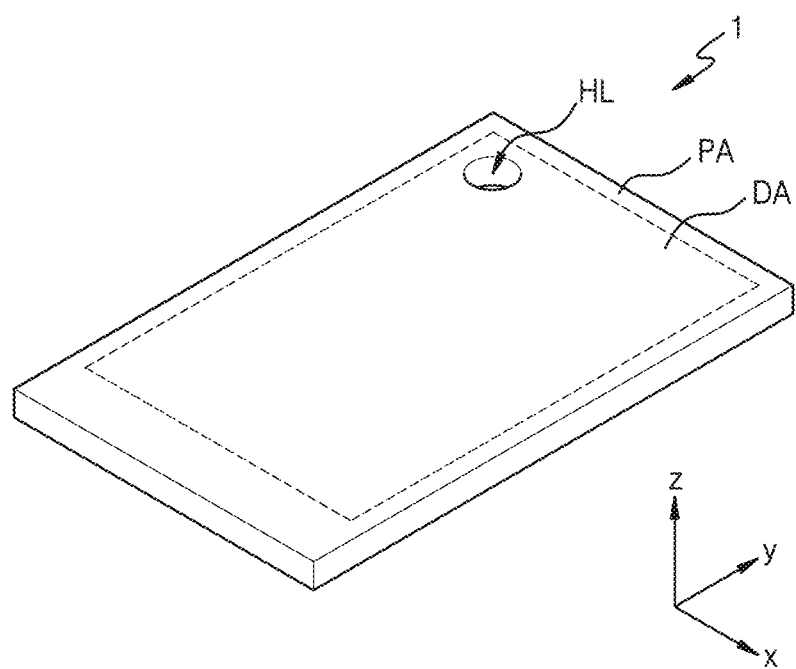
FIG. 1 is a conceptual view of a display apparatus according to an embodiment.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art.

As the disclosure allows for various changes and numerous embodiments, certain embodiments will be illustrated in the drawings and described in the detailed description. Effects and features of the disclosure, and methods for achieving them will be clarified with reference to embodiments described below in detail with reference to the drawings. However, the disclosure is not limited to the following embodiments and may be embodied in various forms.

Hereinafter, embodiments will be described in detail with reference to the accompanying drawings, where like elements are denoted by like reference numerals throughout and a repeated description thereof is omitted.

It will be understood that when a component, such as a layer, a film, a region, or a plate, is referred to as being "on" another component, the component may be directly on the other component or intervening components may be therebetween. Also, sizes of elements in the drawings may be exaggerated or contracted for convenience of explanation. For example, because sizes and thicknesses of elements in the drawings are arbitrarily illustrated for convenience of explanation, the disclosure is not limited thereto.

will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

In the following embodiments, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims.

Hereinafter, embodiments of the invention will be described in detail with reference to the accompanying drawings.

FIG. 1 is a conceptual view of a display apparatus 1 according to an embodiment.

An embodiment of a display apparatus may be implemented as an electronic device such as a smartphone, a mobile phone, a navigation device, a game console, a TV, a vehicle head unit, a notebook computer, a laptop computer, a tablet computer, a personal media player ("PMP"), or a personal digital assistant ("FDA"). Also, the electronic device may be a flexible device.

As shown in FIG. 1, an embodiment of the display apparatus 1 may include a display area DA and a peripheral area PA. The display apparatus 1 may include a substrate, and a shape of the substrate is not limited to a rectangular shape (in an x-y plane) as shown in FIG. 1 and may be variously modified to have any of various shapes such as a circular shape. In an embodiment, the substrate may have a bending area and may be bent in the bending area.

In an embodiment, the substrate may include glass or a metal. Alternatively, the substrate may include at least one selected from various flexible or bendable materials. In one embodiment, for example, the substrate may include a polymer resin such as polyethersulfone, polyacrylate, polyetherimide, polyethylene naphthalate, polyethylene terephthalate, polyphenylene sulfide, polyarylate, polyimide, polycarbonate, or cellulose acetate propionate.

The substrate may be variously modified. In one embodiment, for example, the substrate may have a multi-layer structure including two layers including a polymer resin and a barrier layer including an inorganic material located between the two layers. In such an embodiment, the barrier layer may include silicon oxide, silicon nitride, and/or silicon oxynitride.

A plurality of display devices may be located in the display area DA. In one embodiment, for example, each display device may be an organic light-emitting diode ("OLED"), and may emit red light, green light, blue light, or white light. In an embodiment, one (sub)pixel located in the display area DA of the display apparatus 1 of FIG. 1 includes an OLED, and also includes a thin-film transistor and a capacitor for controlling a degree of light emission of the OLED.

In such an embodiment, a driver, a power supply wiring, etc. may be located in the peripheral area PA. Also, the peripheral area PA may include a pad area to which any of various electronic devices such as a driving integrated circuit or a printed circuit substrate is electrically attached.

Figure 2:
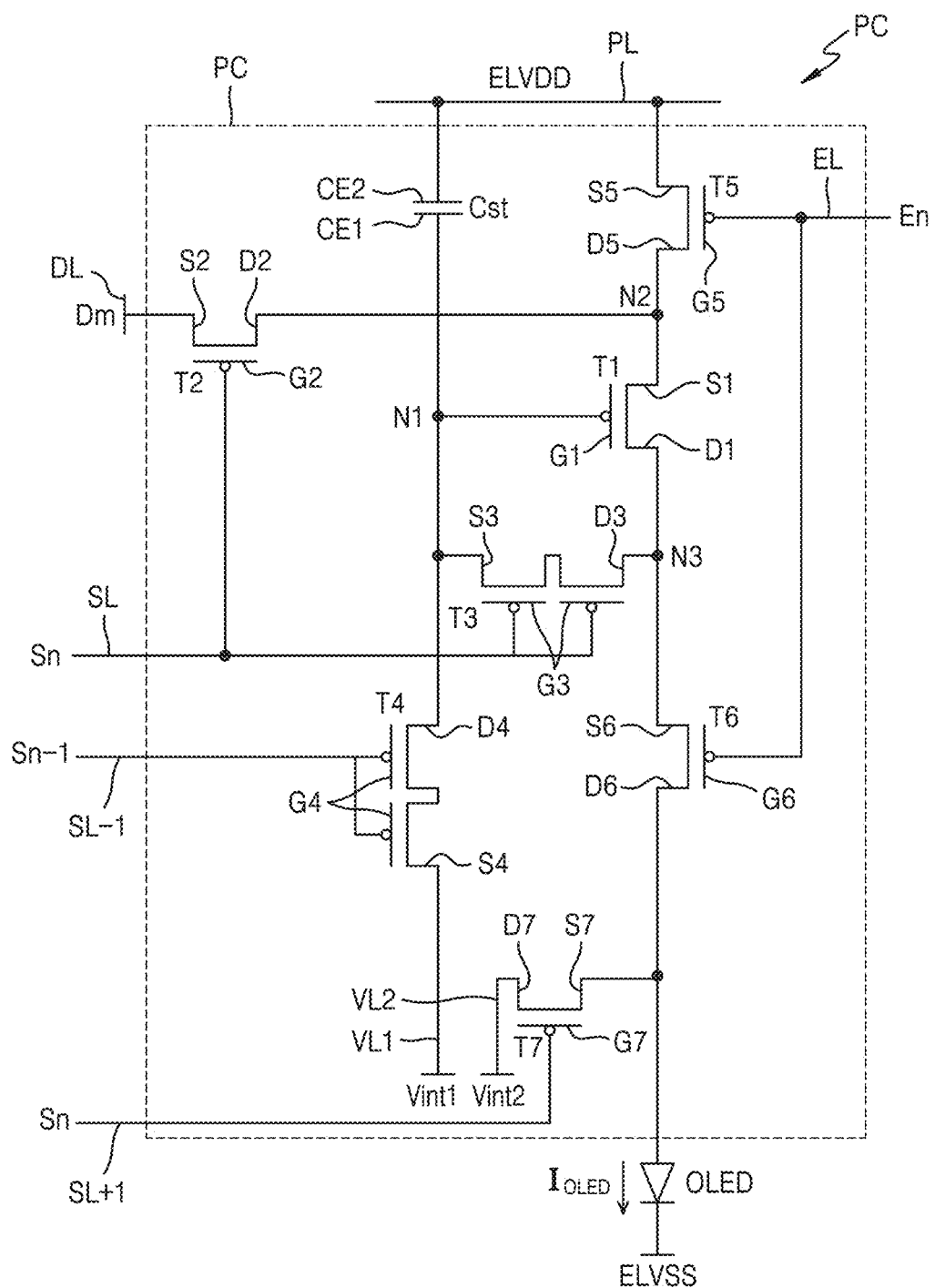
FIG. 2 is an equivalent circuit diagram of a pixel included in the display apparatus of FIG. 1.

FIG. 2 is an equivalent circuit diagram of one (sub)pixel located in the display area DA of the display apparatus 1 of FIG. 1. In an embodiment, a pixel circuit unit located in one (sub)pixel may include a plurality of thin-film transistors and a storage capacitor Cst. The thin-film transistors and the storage capacitor Cst may be connected to signal lines, a first initialization voltage line VL1, a second initialization voltage line VL2, and a power supply voltage line PL.

The signal lines may include a scan line SL that transmits a scan signal Sn, a previous scan line SL−1 that transmits a previous scan signal Sn−1 to a first initialization thin-film transistor T4, a next scan line SL+1 that transmits a scan signal Sn to a second initialization thin-film transistor T7, an emission control line EL that transmits an emission control signal En to an operation control thin-film transistor T5 and an emission control thin-film transistor T6, and a data line DL that intersects the scan line SL and transmits a data signal Dm. The power supply voltage line PL may transmit a driving voltage ELVDD to a driving thin-film transistor T1, the first initialization voltage line VL1 may transmit a first initialization voltage Vint1 to the first initialization thin-film transistor T4, and the second initialization voltage line VL2 may transmit a second initialization voltage Vint2 to the second initialization thin-film transistor T7.

A driving gate electrode G1 that is a first gate electrode of the driving thin-film transistor T1 (or a first transistor) is connected to a lower electrode CE1 of the storage capacitor Cst, a driving source region S1 of the driving thin-film transistor T1 is connected to the power supply voltage line PL via the operation control thin-film transistor T5, and a driving drain region D1 of the driving thin-film transistor T1 is electrically connected to a pixel electrode of a main organic light-emitting diode OLED via the emission control thin-film transistor T6. In such an embodiment, the driving thin-film transistor T1 may control the amount of current flowing from a second node N2 connected to the power supply voltage line PL to the main organic light-emitting diode OLED, in response to a voltage applied to a first node N1, that is, a voltage applied to the driving gate electrode G1. Accordingly, the driving thin-film transistor T1 receives the data signal Dm and supplies driving current $I_{OLED}$ to the main organic light-emitting diode OLED based on a switching operation of a switching thin-film transistor T2. The operation control thin-film transistor T5 may be connected between the second node N2 and the power supply voltage line PL.

A switching gate electrode G2 that is a second gate electrode of the switching thin-film transistor T2 (or a second transistor) is connected to the scan line SL, a switching source region S2 of the switching thin-film transistor T2 is connected to the data line DL, and a switching drain region D2 of the switching thin-film transistor T2 is connected to the second node N2, is connected to the driving source region S1 of the driving thin-film transistor T1, and is connected to the power supply voltage line PL via the operation control thin-film transistor T5. The switching thin-film transistor T2 is turned on in response to a scan signal Sn received through the scan line SL, and performs a switching operation of transmitting the data signal Dm transmitted from the data line DL to the driving source region S1 of the driving thin-film transistor T1.

A compensation thin-film transistor T3 (or a third transistor) may be connected between the first node N1 and a third node N3 between the driving thin-film transistor T1 and the main organic light-emitting diode OLED, and may diode-connect the driving thin-film transistor T1 in response to a voltage applied to a compensation gate electrode G3 (or a third gate electrode) thereof. In such an embodiment, the compensation gate electrode G3 of the compensation thin-film transistor T3 is connected to the scan line SL, a compensation drain region D3 of the compensation thin-film transistor T3 is connected to the driving drain region D1 of the driving thin-film transistor T1 and is connected to a pixel electrode of the main organic light-emitting diode OLED via the emission control thin-film transistor T6, and a compensation source region S3 of the compensation thin-film transistor T3 is connected to the lower electrode CE1 of the storage capacitor Cst, a first initialization drain region D4 of the first initialization thin-film transistor T4, and the driving gate electrode G1 of the driving thin-film transistor T1.

The compensation thin-film transistor T3 is turned on in response to the scan signal Sn received through the scan line SL, and diode-connects the driving thin-film transistor T1 by electrically connecting the driving gate electrode G1 and the driving drain region D1 of the driving thin-film transistor T1. In an embodiment, the compensation thin-film transistor T3 has a dual gate electrode structure. In such an embodiment, the compensation gate electrode G3 of the compensation thin-film transistor T3 includes a first third gate electrode G3-1 (see FIG. 3) and a second third gate electrode G3-2 (see FIG. 3).

The first initialization thin-film transistor T4 (or a fourth transistor) may be connected between the first node N1 and the first initialization voltage line VL1, and may initialize a voltage of the driving gate electrode G1 in response to a voltage applied to a first initialization gate electrode G4 (or a fourth gate electrode) thereof. In such an embodiment, the first initialization gate electrode G4 of the first initialization thin-film transistor T4 is connected to the previous scan line SL−1, a first initialization source region S4 of the first initialization thin-film transistor T4 is connected to the first initialization voltage line VL1, and the first initialization drain region D4 of the first initialization thin-film transistor T4 is connected to the lower electrode CE1 of the storage capacitor Cst, the compensation source region S3 of the compensation thin-film transistor T3, and the driving gate electrode G1 of the driving thin-film transistor T1. The first initialization thin-film transistor T4 is turned on in response to the previous scan signal Sn−1 received through the previous scan line SL−1, and performs an initialization operation of initializing a voltage of the driving gate electrode G1 of the driving thin-film transistor T1 by transmitting the first initialization voltage Vint1 to the driving gate electrode G1 of the driving thin-film transistor T1. In an embodiment, the first initialization thin-film transistor T4 has a dual gate electrode structure. In such an embodiment, the first initialization gate electrode G4 of the first initialization thin-film transistor T4 includes a first fourth gate electrode G4-1 (see FIG. 3) and a second fourth gate electrode G4-2 (see FIG. 3).

The operation control thin-film transistor T5 (or a fifth transistor) may be connected between the second node N2 and the power supply voltage line PL, and may be turned on in response to a voltage applied to an operation control gate electrode G5 (or a fifth gate electrode) thereof. In such an embodiment, the operation control gate electrode G5 of the operation control thin-film transistor T5 is connected to the emission control line EL, an operation control source region S5 of the operation control thin-film transistor T5 is connected to the power supply voltage line PL, and an operation control drain region D5 of the operation control thin-film transistor T5 is connected to the driving source region S1 of the driving thin-film transistor T1 and the switching drain region D2 of the switching thin-film transistor T2.

The emission control thin-film transistor T6 (or a sixth transistor) may be connected between the third node N3 and the main organic light-emitting diode OLED, and may be turned on in response to a voltage applied to an emission control gate electrode G6 (or a sixth gate electrode) thereof from the emission control line EL. In such an embodiment, the emission control gate electrode G6 of the emission control thin-film transistor T6 is connected to the emission control line EL, an emission control source region S6 of the emission control thin-film transistor T6 is connected to the driving drain region D1 of the driving thin-film transistor T1 and the compensation drain region D3 of the compensation thin-film transistor T3, and an emission control drain region D6 of the emission control thin-film transistor T6 is electrically connected to a second initialization source region S7 of the second initialization thin-film transistor T7 and the pixel electrode of the main organic light-emitting diode OLED.

The operation control thin-film transistor T5 and the emission control thin-film transistor T6 are simultaneously turned on in response to the emission control signal En received through the emission control line EL, so that the driving voltage ELVDD is transmitted to the main organic light-emitting diode OLED and the driving current IDLED flows through the organic light-emitting diode OLED.

The second initialization thin-film transistor T7 (or a seventh transistor) is connected between the second initialization voltage line VL2 and the third node N3 between the driving thin-film transistor T1 and the main organic light-emitting diode OLED. In an embodiment, a second initialization gate electrode G7 (or a seventh gate electrode) of the second initialization thin-film transistor T7 is connected to the next scan line SL+1, the second initialization source region S7 of the second initialization thin-film transistor T7 is connected to the emission control drain region D6 of the emission control thin-film transistor T6 and the pixel electrode of the main organic light-emitting diode OLED, and a second initialization drain region D7 of the second initialization thin-film transistor T7 is connected to the second initialization voltage line VL2. The second initialization thin-film transistor T7 may initialize a voltage of the pixel electrode of the main organic light-emitting diode OLED in response to a voltage applied to the second initialization gate electrode G7 that is a seventh gate electrode.

In such an embodiment, the scan line SL and the next scan line SL+1 are electrically connected to each other, such that a same scan signal Sn may be applied to the scan line SL and the next scan line SL+1. Accordingly, the second initialization thin-film transistor T7 may be turned on in response to the scan signal Sn received through the next scan line SL+1, and may perform an operation of initializing the pixel electrode of the main organic light-emitting diode OLED.

An upper electrode CE2 of the storage capacitor Cst is connected to the power supply voltage line PL, and a common electrode of the main organic light-emitting diode OLED is connected to a common voltage ELVSS. Accordingly, the main organic light-emitting diode OLED may receive the driving current $I_{OLED}$ from the driving thin-film transistor T1 to emit light and display an image.

In an embodiment, as shown in FIG. 2, the compensation thin-film transistor T3 may have a dual gate electrode structure. Alternatively, the compensation thin-film transistor T3 may include a single gate electrode. In an embodiment, as shown in FIG. 2, the first initialization thin-film transistor T4 may have a dual gate electrode structure. Alternatively, the first initialization thin-film transistor T4 may include a single gate electrode.

Figure 3:
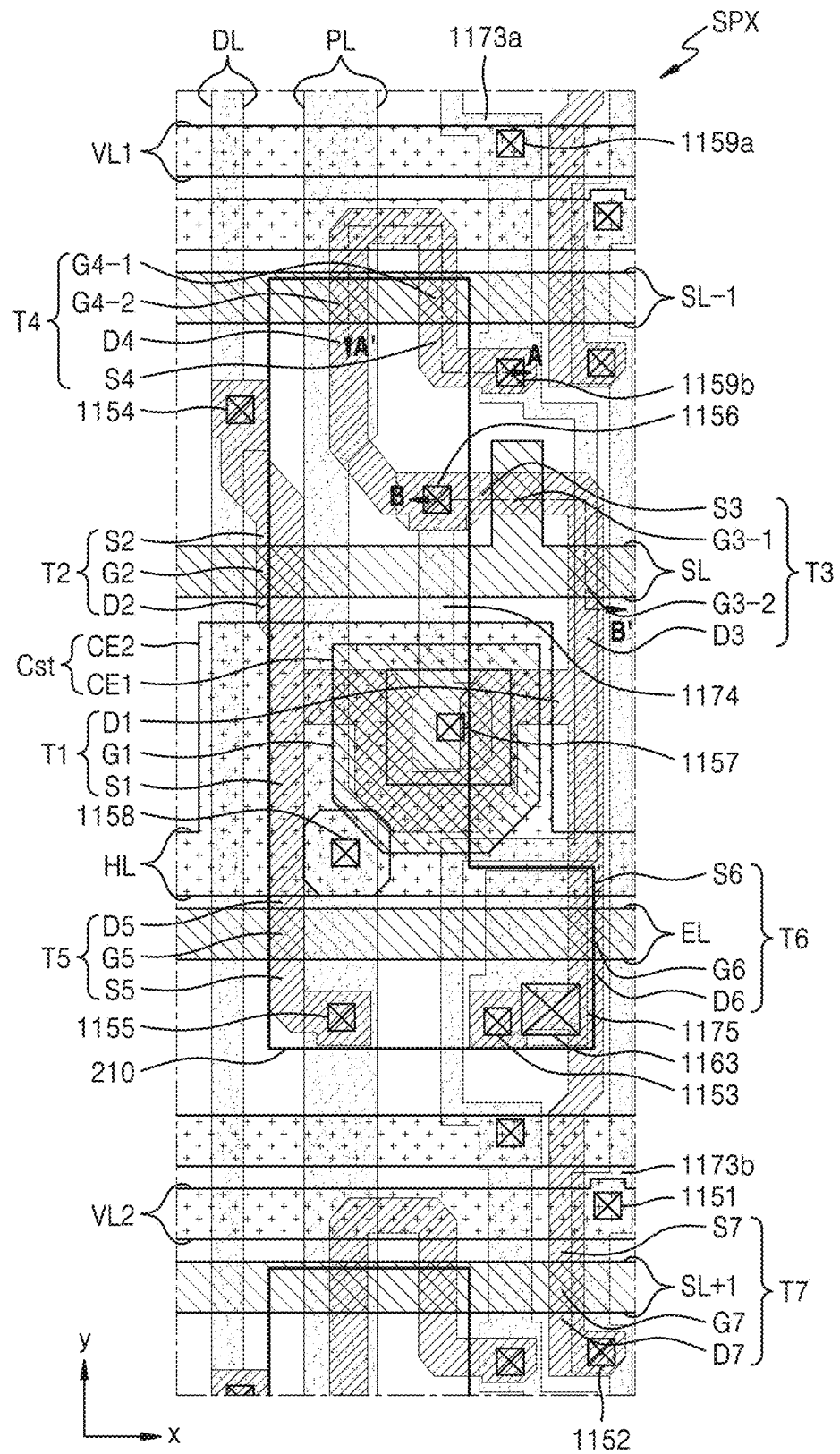
FIG. 3 is a view illustrating positions of thin-film transistors and a capacitor in a pixel of FIG. 2.
Figure 4:
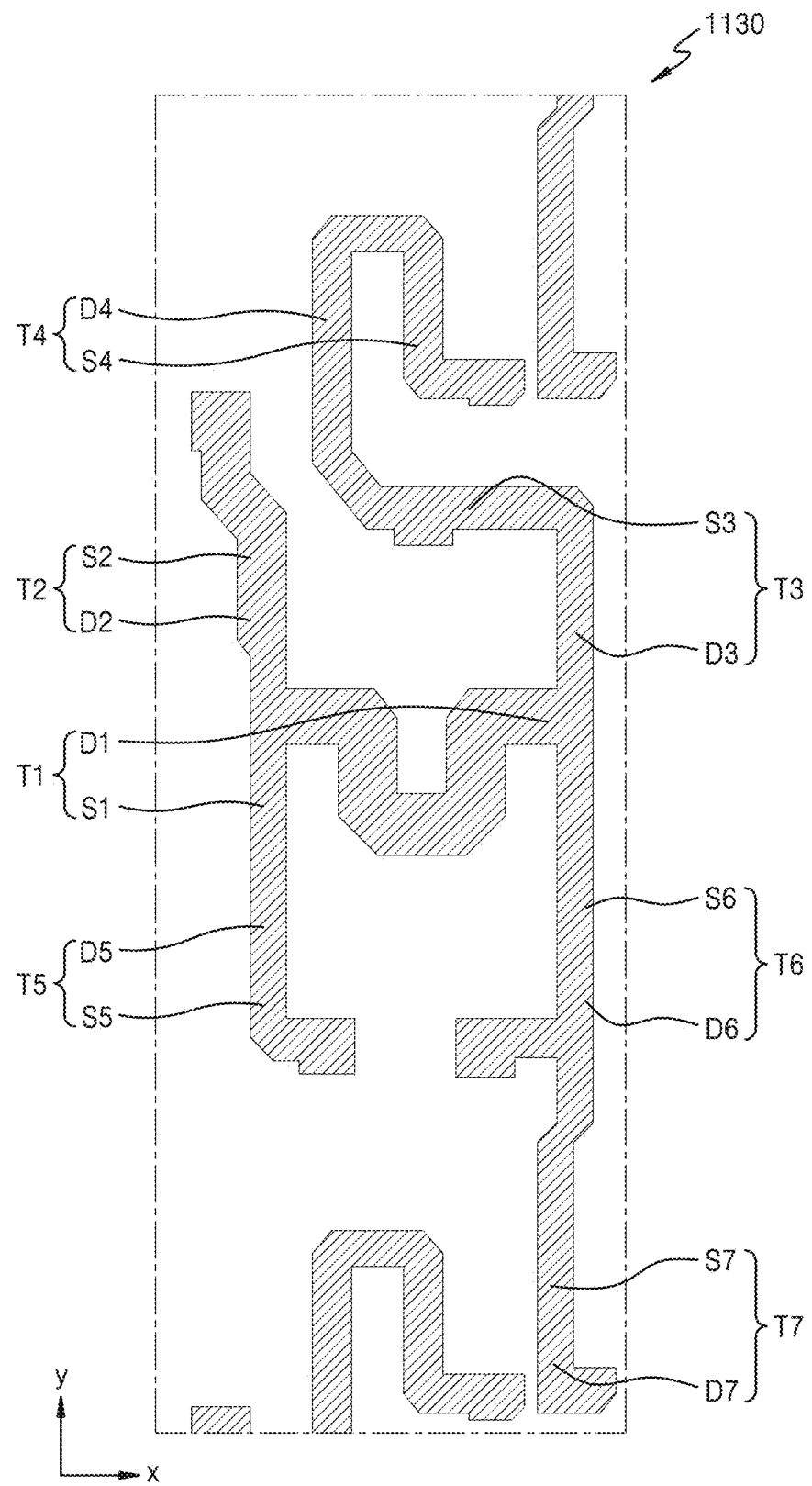
FIG. 4 is a view illustrating an arrangement of a semiconductor layer of FIG. 3.
Figure 5:
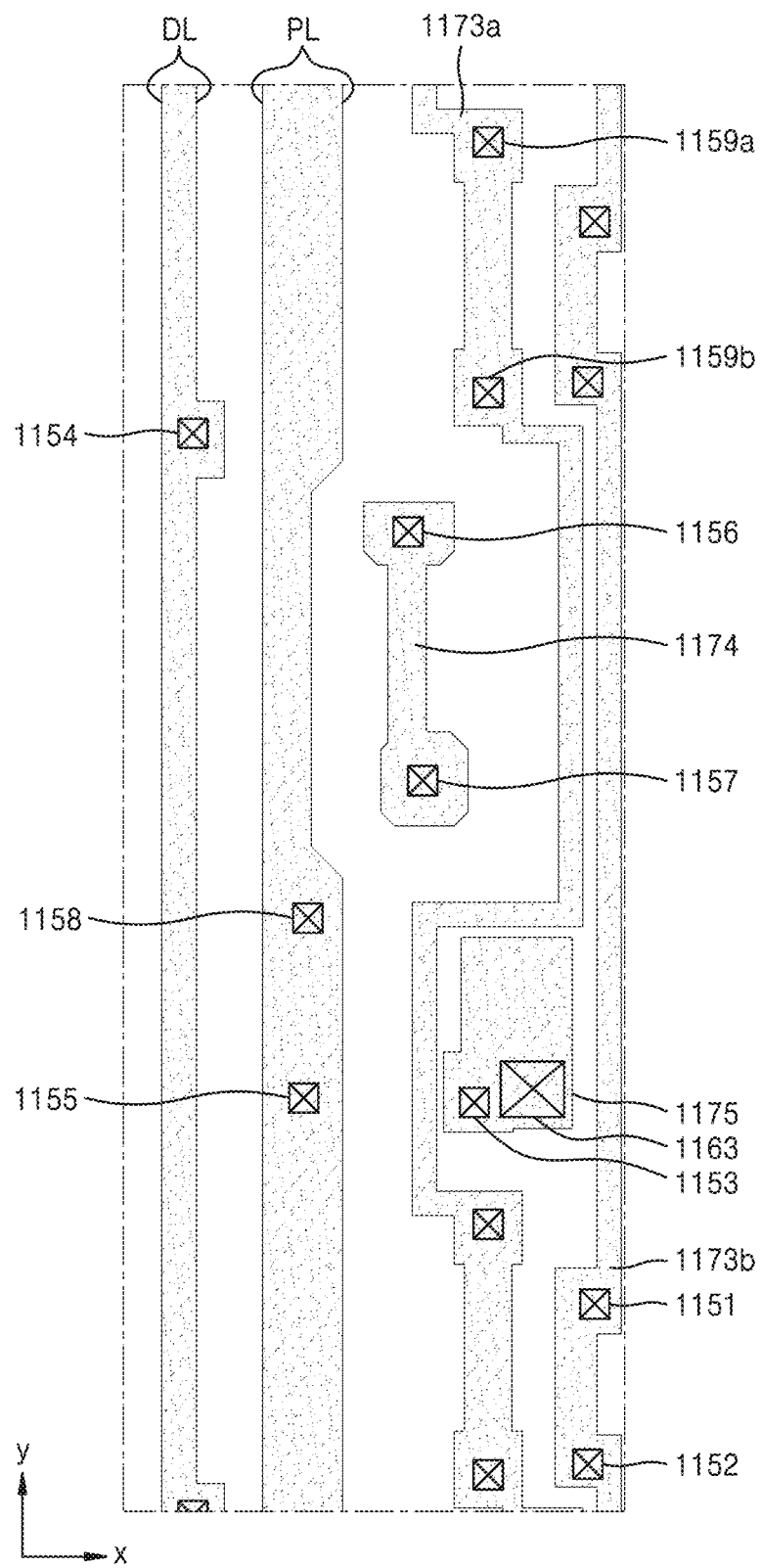
FIG. 5 is a view illustrating an arrangement of a first initialization connection line and a second initialization connection line of FIG. 3.
Figure 7:
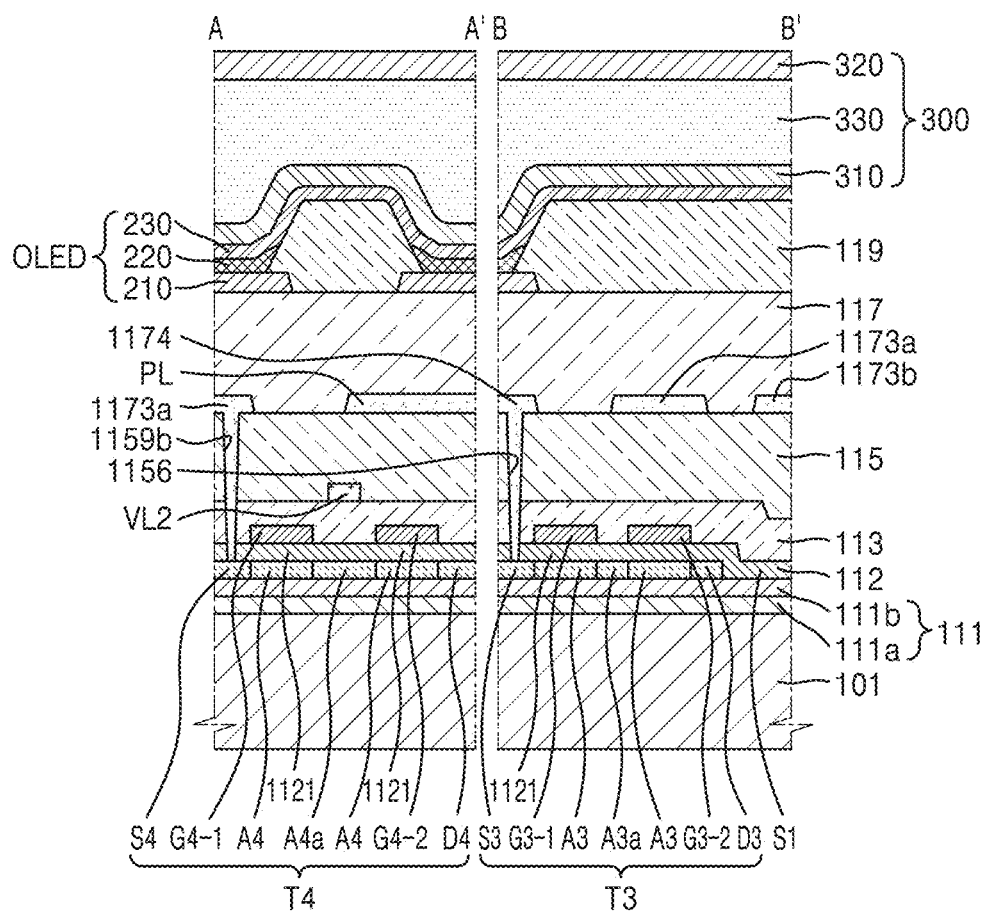
FIG. 7 is a cross-sectional view taken along lines A-A' and B-B' of FIG. 3.

FIG. 3 is a view illustrating positions of a plurality of thin-film transistors and a capacitor in a (sub)pixel of FIG. 2. FIG. 4 is a view illustrating an arrangement of a semiconductor layer 1130 that is a part of a display apparatus of FIG. 3. FIG. 5 is a view illustrating an arrangement of a first initialization connection line 1173a and a second initialization connection line 1173b of FIG. 3. FIG. 7 is a cross-sectional view taken along lines A-A' and B-B' of FIG. 3.

The driving thin-film transistor T1, the switching thin-film transistor T2, the compensation thin-film transistor T3, the first initialization thin-film transistor T4, the operation control thin-film transistor T5, the emission control thin-film transistor T6, and the second initialization thin-film transistor T7 are arranged along the semiconductor layer 1130. Some portions of the semiconductor layer 1130 may constitute semiconductor layers of the driving thin-film transistor T1, the switching thin-film transistor T2, the compensation thin-film transistor T3, the first initialization thin-film transistor T4, the operation control thin-film transistor T5, the emission control thin-film transistor T6, and the second initialization thin-film transistor T7. In such an embodiment, some portions of the semiconductor layer 1130 may constitute active regions, source regions, or drain regions of thin-film transistors.

The semiconductor layer 1130 may be disposed or formed on a substrate 101. A buffer layer 111 may be disposed or formed on the substrate 101, and the semiconductor layer 1130 may be formed on the buffer layer 111.

The buffer layer 111 may reduce or block penetration of foreign materials, moisture, or external air from the bottom of the substrate 101 and may planarize the substrate 101. The buffer layer 111 may include an inorganic material such as oxide or nitride, an organic material, or a combination of an organic material and an inorganic material, and may have a single or multi-layer structure including an inorganic material and an organic material. In one embodiment, for example, the buffer layer 111 may have a structure in which a first buffer layer 111a and a second buffer layer 111b are stacked, and in such an embodiment, the first buffer layer 111a and the second buffer layer 111b may include different materials from each other. In one embodiment, for example, the first buffer layer 111a may include silicon nitride, and the second buffer layer 111b may include silicon oxide.

In an embodiment, where the first buffer layer 111a includes silicon nitride, hydrogen may be included when the silicon nitride is formed. Accordingly, the carrier mobility of the semiconductor layer 1130 formed on the buffer layer 111 may be improved, and electrical characteristics of a TFT may be improved. In an embodiment, the semiconductor layer 1130 may include a silicon material, and in such an embodiment, interfacial adhesion properties between the semiconductor layer 1130 including silicon and the second buffer layer 111b including silicon oxide may be improved, and electrical characteristics of the TFT may be improved.

The semiconductor layer 1130 may include low-temperature polysilicon ("LTPS"). A polysilicon material has a high electron mobility (e.g., 100 square centimeter per volt-second ($cm^2/V \cdot s$) or more), and thus has low energy consumption and high reliability. Alternatively, the semiconductor layer 1130 may include amorphous silicon ("a-Si") and/or an oxide semiconductor. Alternatively, some of thin-film transistors may include LTPS, and others may include a-Si and/or an oxide semiconductor.

Source regions and drain regions of the semiconductor layer 1130 may be doped with impurities, and the impurities may include N-type impurities or P-type impurities. Each source region and each drain region may respectively correspond to a source electrode and a drain electrode. The source region and the drain region may be changed to each other according to properties of a thin-film transistor. Hereinafter, the terms "source region" and "drain region" are used instead of the terms "source electrode" and "drain electrode". In the equivalent circuit diagram of FIG. 2, specific portions of the semiconductor layer 1130 are doped with P-type impurities, and thin-film transistors are implemented as p-channel metal-oxide-semiconductor ("PMOS") field-effect transistors ("MOSFET"s). Other portions of the semiconductor layer 1130 may also be doped with impurities, and may function as wirings for electrically connecting the thin-film transistors and/or a capacitor.

A first gate insulating film 112 may be disposed on the semiconductor layer 1130, and the driving gate electrode G1, the scan line SL, the previous scan line SL−1, the next scan line SL+1, and the emission control line EL may be disposed on the first gate insulating film 112. The first gate insulating film 112 may include silicon oxide ($SiO_2$), silicon nitride (SiNx), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$).

Portions of the scan line SL overlapping second and third active regions A2 and A3 of the switching and compensation thin-film transistors T2 and T3 may define respectively the switching gate electrode G2 and the compensation gate electrode G3, a portion of the previous scan line SL−1 overlapping a fourth active region A4 of the first initialization thin-film transistor T4 may define the first initialization gate electrode G4, a portion of the next scan line SL+1 overlapping a second active region A7 of the second initialization thin-film transistor T7 may define the second initialization gate electrode G7, and portions of the emission control line EL overlapping the operation control thin-film transistor T5 and the emission control thin-film transistor T6 may define respectively the operation control gate electrode G5 and the emission control gate electrode G6.

Each of the driving gate electrode G1, the scan line SL, the previous scan line SL−1, the next scan line SL+1, and the emission control line EL may include a conductive material including molybdenum (Mo), aluminum (Al), copper (Cu), or titanium (Ti), and may have a single or multi-layer structure including the above material. In one embodiment, for example, each of the driving gate electrode G1, the scan line SL, the previous scan line SL−1, the next scan line SL+1, and the emission control line EL may have a multi-layer structure including a Mo layer and an Al layer, or may have a multi-layer structure including a Mo layer, an Al layer, and a Mo layer.

A second gate insulating film 113 may be disposed or provided on the driving gate electrode G1, the scan line SL, the previous scan line SL−1, the next scan line SL+1, and the emission control line EL. The second gate insulating film 113 may include silicon oxide ($SiO_2$), silicon nitride (SiNx), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$).

An electrode voltage line HL, the first initialization voltage line VL1, and the second initialization voltage line VL2 may be disposed on the second gate insulating film 113. The electrode voltage line HL may cover at least a part of the driving gate electrode G1, and may form the storage capacitor Cst along with the driving gate electrode G1.

The lower electrode CE1 of the storage capacitor Cst may be integrally formed with the gate electrode G1 of the driving thin-film transistor T1, as a single unitary unit. In one embodiment, for example, the gate electrode G1 of the driving thin-film transistor T1 may function as the lower electrode CE1 of the storage capacitor Cst. A portion of the electrode voltage line HL overlapping the driving gate electrode G1 may be the upper electrode CE2 of the storage capacitor Cst. Accordingly, the second gate insulating film 113 may function as a dielectric layer of the storage capacitor Cst.

Each of the electrode voltage line HL, the first initialization voltage line VL1, and the second initialization voltage line VL2 may include a conductive material including molybdenum (Mo), aluminum (Al), copper (Cu), or titanium (Ti), and may have a single or multi-layer structure including the above material. In one embodiment, for example, each of the electrode voltage line HL, the first initialization voltage line VL1, and the second initialization voltage line VL2 may have a multi-layer structure including a Mo layer and an Al layer, or may have a multi-layer structure including a Mo layer, an Al layer, and a Mo layer.

An interlayer insulating layer 115 is disposed on the electrode voltage line HL, the first initialization voltage line VL1, and the second initialization voltage line VL2. The interlayer insulating layer 115 may include silicon oxide ($SiO_2$), silicon nitride (SiNx), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$).

The data line DL, the power supply voltage line PL, the first and second initialization connection lines 1173a and 1173b, a node connection line 1174, and a connection metal 1175 may be disposed on the interlayer insulating layer 115. Each of the data line DL, the power supply voltage line PL, the first and second initialization connection lines 1173a and 1173b, the node connection line 1174, and the connection metal 1175 may include a conductive material including molybdenum (Mo), aluminum (Al), copper (Cu), or titanium (Ti), and may have a single or multi-layer structure including the above material. In one embodiment, for example, each of the data line DL, the power supply voltage line PL, the first and second initialization connection lines 1173a and 1173b, the node connection line 1174, and the connection metal 1175 may have a multi-layer structure including a Ti layer, an Al layer, and a Ti layer.

The data line DL may be connected to the switching source region S2 of the switching thin-film transistor T2 through a contact hole 1154. In an embodiment, a part of the data line DL may define a switching source electrode.

The power supply voltage line PL may be connected to the upper electrode CE2 of the capacitor Cst through a contact hole 1158 defined in the interlayer insulating layer 115. Accordingly, the electrode voltage line HL and the power supply voltage line PL may have a same voltage level (constant voltage). In an embodiment, the power supply voltage line PL may be connected to the operation control drain region D5 through a contact hole 1155.

The first initialization voltage line VL1 is connected to the first initialization connection line 1173a through a contact hole 1159a, and the first initialization connection line 1173a is connected to the first initialization thin-film transistor T4 through a contact hole 1159b. The second initialization voltage line VL2 may be connected to the second initialization connection line 1173b through a contact hole 1151, and the second initialization connection line 1173b may be connected to the second initialization thin-film transistor T7 through a contact hole 1152. The first initialization voltage line VL1 and the second initialization voltage line VL2 may have a same constant voltage (e.g., −2 volts (V)) as each other.

One end of the node connection line 1174 may be connected to the compensation source region S3 through a contact hole 1156, and the other end of the node connection line 1174 may be connected to the driving gate electrode G1 through a contact hole 1157.

The connection metal 1175 is connected to a semiconductor layer of the emission control thin-film transistor T6 through a contact hole 1153 defined through the second gate insulating film 113 and the first gate insulating film 112. The connection metal 1175 is connected to a pixel electrode 210 of the organic light-emitting diode OLED through a contact hole 1163. Accordingly, the emission control thin-film transistor T6 may be electrically connected to the pixel electrode 210 of the organic light-emitting diode OLED.

A planarization layer 117 may be disposed on the data line DL, the power supply voltage line PL, the first and second initialization connection lines 1173a and 1173b, the node connection line 1174, and the connection metal 1175, and the organic light-emitting diode OLED may be disposed on the planarization layer 117.

FIG. 2 shows an embodiment of one pixel circuit PC, and FIG. 3 shows a structure one (sub)pixel SPX. In such an embodiment, a plurality of subpixels SPX having a same pixel circuit PC as that of FIG. 2 may be arranged in a first direction (x-axis direction) and a second direction (y-axis direction), and in such an embodiment, the previous scan line SL−1 and the next scan line SL+1 may be shared by two pixel circuits PC that are adjacent to each other in the second direction (y-axis direction).

In an embodiment, the previous scan line SL−1 may be electrically connected to the second initialization thin-film transistor T7 of another pixel circuit PC located in +y direction from the pixel circuit PC of FIG. 3 in the second direction (y-axis direction). Accordingly, a previous scan signal applied to the previous scan line SL−1 may be transmitted as a next scan signal to a second initialization thin-film transistor of the other pixel circuit PC. In such an embodiment, the next scan line SL+1 may be electrically connected to the first initialization thin-film transistor T4 of another pixel circuit PC located in −y direction from the pixel circuit PC of FIG. 3 in the second direction (y-axis direction) and may transmit a previous scan signal and an initialization voltage.

The planarization layer 117 disposed on the data line DL, the power supply voltage line PL, the first and second initialization connection lines 1173a and 1173b, the node connection line 1174, and the connection metal 1175 may have a flat top surface to planarize the pixel electrode 210. In an embodiment, the planarization layer 117 may include an organic material, and may have a single or multi-layer structure. The planarization layer 117 may include benzocyclobutene ("BOB"), polyimide, hexamethyldisiloxane ("HMDSO"), a general-purpose polymer such as polymethyl methacrylate ("PMMA") or polystyrene ("PS"), a polymer derivative having a phenol-based group, an acrylic polymer, an imide-based polymer, an aryl ether-based polymer, an amide-based polymer, a fluorinated polymer, a p-xylene-based polymer, a vinyl alcohol-based polymer, or a blend thereof. In an embodiment, the planarization layer 117 may include an inorganic material. The planarization layer 117 may include silicon oxide ($SiO_2$), silicon nitride (SiNx), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$). In an embodiment, where the planarization layer 117 includes an inorganic material, chemical mechanical polishing may be performed when necessary. In an embodiment, the planarization layer 117 may include both an organic material and an inorganic material.

The organic light-emitting diode OLED may include the pixel electrode 210, a common electrode 230 disposed over the pixel electrode 210, and an intermediate layer 220 disposed between the pixel electrode 210 and the common electrode 230 and including an emission layer.

The pixel electrode 210 may be connected to the connection metal 1175 through the contact hole 1163 defined in the planarization layer 117, and the connection metal 1175 may be connected to an emission control drain region through the contact hole 1153 defined in lower insulating layers. The pixel electrode 210 may be a (semi-)transmissive electrode or a reflective electrode. In an embodiment, the pixel electrode 210 may include a reflective film including silver (Ag), magnesium (Mg), aluminum (Al), platinum (Pt), palladium (Pd), gold (Au), nickel (Ni), neodymium (Nd), iridium (Ir), chromium (Cr), or a compound thereof, and a transparent or semi-transparent electrode layer on the reflective film. The transparent or semi-transparent electrode layer may include at least one selected from indium tin oxide ("ITO"), indium zinc oxide ("IZO"), zinc oxide (ZnO), indium oxide ($In_2O_3$), indium gallium oxide ("IGO"), and aluminum zinc oxide ("AZO"). In an embodiment, the pixel electrode 210 may have a stacked structure including ITO/Ag/ITO.

A pixel-defining film 119 may be disposed on the planarization layer 117, and an opening portion, which exposes a central portion of the pixel electrode 210 to define an emission area of a pixel, is defined through the pixel-defining film 119. In an embodiment, the pixel-defining film119 may increase a distance between an edge of the pixel electrode 210 and the common electrode 230 disposed over the pixel electrode 210, to prevent an arc or the like from occurring on the edge of the pixel electrode 210. The pixel-defining film 119 may include or be formed of an organic insulating material such as polyimide, polyamide, acrylic resin, BCB, HMDSO, or phenolic resin by using spin coating or the like.

The intermediate layer 220 may include an organic emission layer. The organic emission layer may include an organic material including a fluorescent or phosphorescent material that emits red, green, blue, or white light. The organic emission layer may include or be formed of a low molecular weight organic material or a high molecular weight organic material, and functional layers such as a hole transport layer ("HTL"), a hole injection layer ("HIL"), an electron transport layer ("ETL"), and an electron injection layer ("EIL") may be selectively disposed under and over the organic emission layer. The intermediate layer 220 may be disposed to correspond to each of a plurality of pixel electrodes 210. However, the disclosure is not limited thereto, and a layer such as an HTL, an HIL, an ETL, or an EIL from among layers included in the intermediate layer 220 may be integrally formed over the plurality of pixel electrodes 210, as a single unitary unit.

The common electrode 230 may be a light-transmitting electrode or a reflective electrode. In an embodiment, the common electrode 230 may be a transparent or semi-transparent electrode and may include a metal thin film having a low work function including lithium (Li), calcium (Ca), LiF/Ca, LiF/Al, aluminum (Al), silver (Ag), magnesium (Mg), or a compound thereof. In an embodiment, a transparent conductive oxide (TCO) film including ITO, IZO, ZnO, or $In_2O_3$ may be further disposed on the metal thin film. The common electrode 230 may be integrally formed to correspond to the plurality of pixel electrodes 210, as a single unitary unit.

An encapsulation layer 300 including a first inorganic encapsulation layer 310, a second inorganic encapsulation layer 320, and an organic encapsulation layer 330 disposed between the first inorganic encapsulation layer 310 and the second inorganic encapsulation layer 320 may be disposed on the common electrode 230. Each of the first inorganic encapsulation layer 310 and the second inorganic encapsulation layer 320 may include silicon oxide ($SiO_2$), silicon nitride (SiNx), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$). The organic encapsulation layer 330 may include polyethylene terephthalate, polyethylene naphthalate, polycarbonate, polyimide, polyethylene sulfonate, polyoxymethylene, polyarylate, hexamethyldisiloxane, acrylic resin (e.g., polymethyl methacrylate, polyacrylic acid, etc.), or a combination thereof.

In an embodiment, as described above, the first gate insulating film 112 may be disposed on the semiconductor layer 1130, and the driving gate electrode G1, the scan line SL, the previous scan line SL−1, the next scan line SL+1, and the emission control line EL may be disposed on the first gate insulating film 112. The scan line SL, the previous scan line SL−1, the next scan line SL+1, and the emission control line EL include the switching gate electrode G2, the compensation gate electrode G3, the first initialization gate electrode G4, the operation control gate electrode G5, the emission control gate electrode G6, and the second initialization gate electrode G7 as described above. Accordingly, the first gate insulating film 112 is disposed between the semiconductor layer 1130 and the driving gate electrode G1, the switching gate electrode G2, the compensation gate electrode G3, the first initialization gate electrode G4, the operation control gate electrode G5, the emission control gate electrode G6, and the second initialization gate electrode G7.

Figure 6:
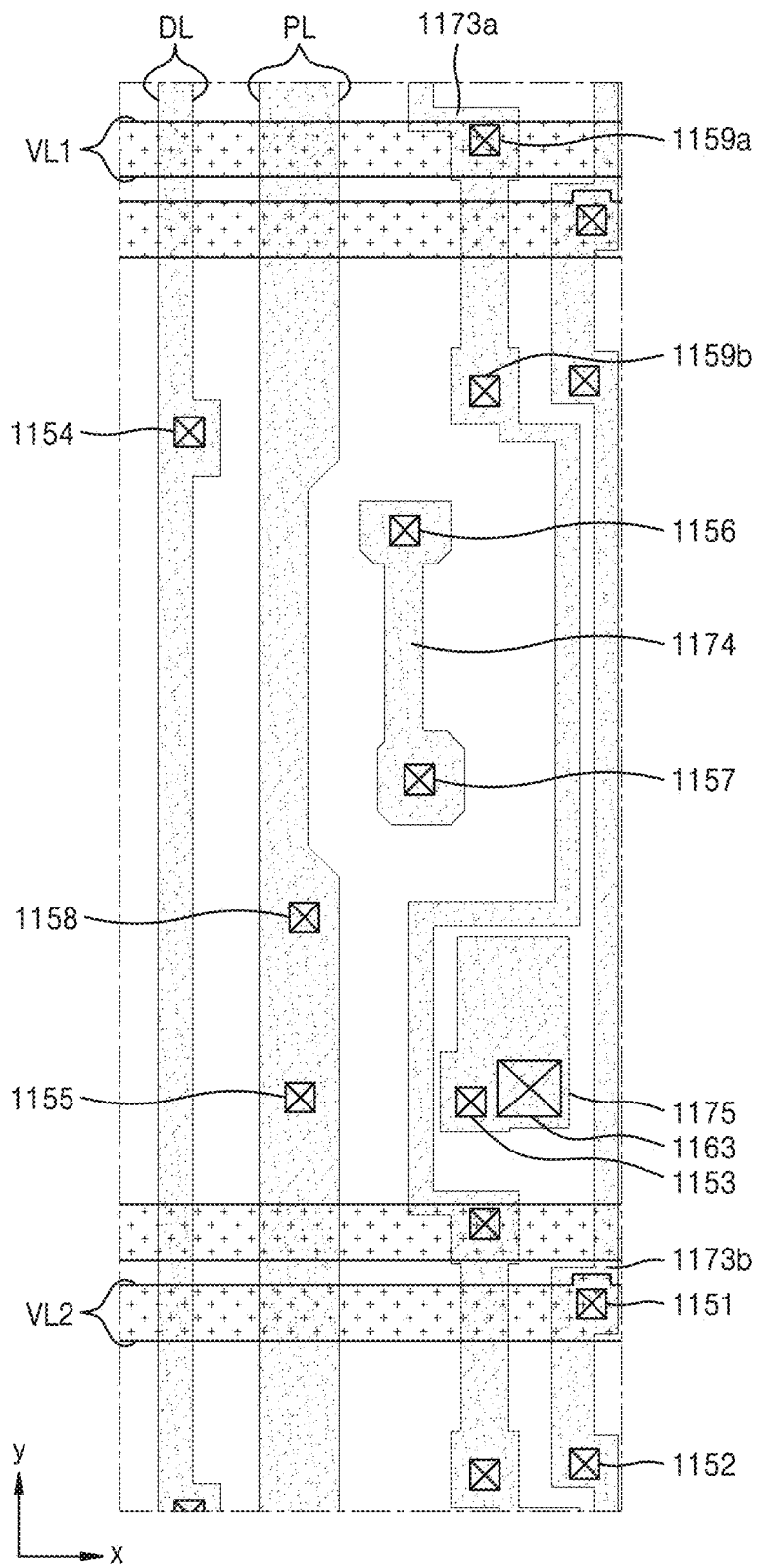
FIG. 6 is a view illustrating an arrangement of a first initialization voltage line, a second initialization voltage line, first initialization connection lines, and second initialization connection lines of FIG. 3.
Figure 8:
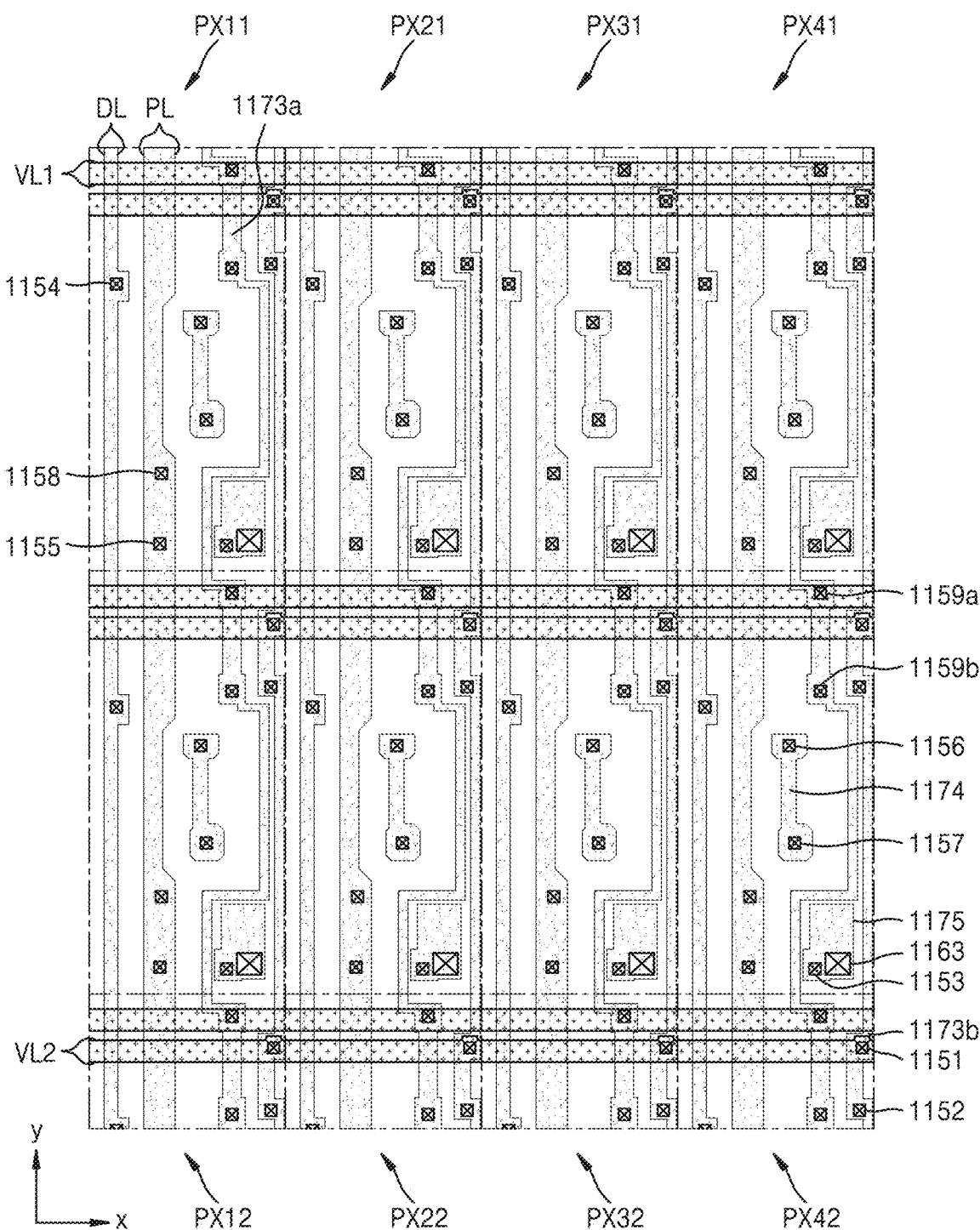
FIG. 8 is a view illustrating an arrangement of first initialization voltage lines, second initialization voltage lines, first initialization connection lines, and second initialization connection lines in a plurality of pixels of a display apparatus according to an embodiment.
Figure 9:
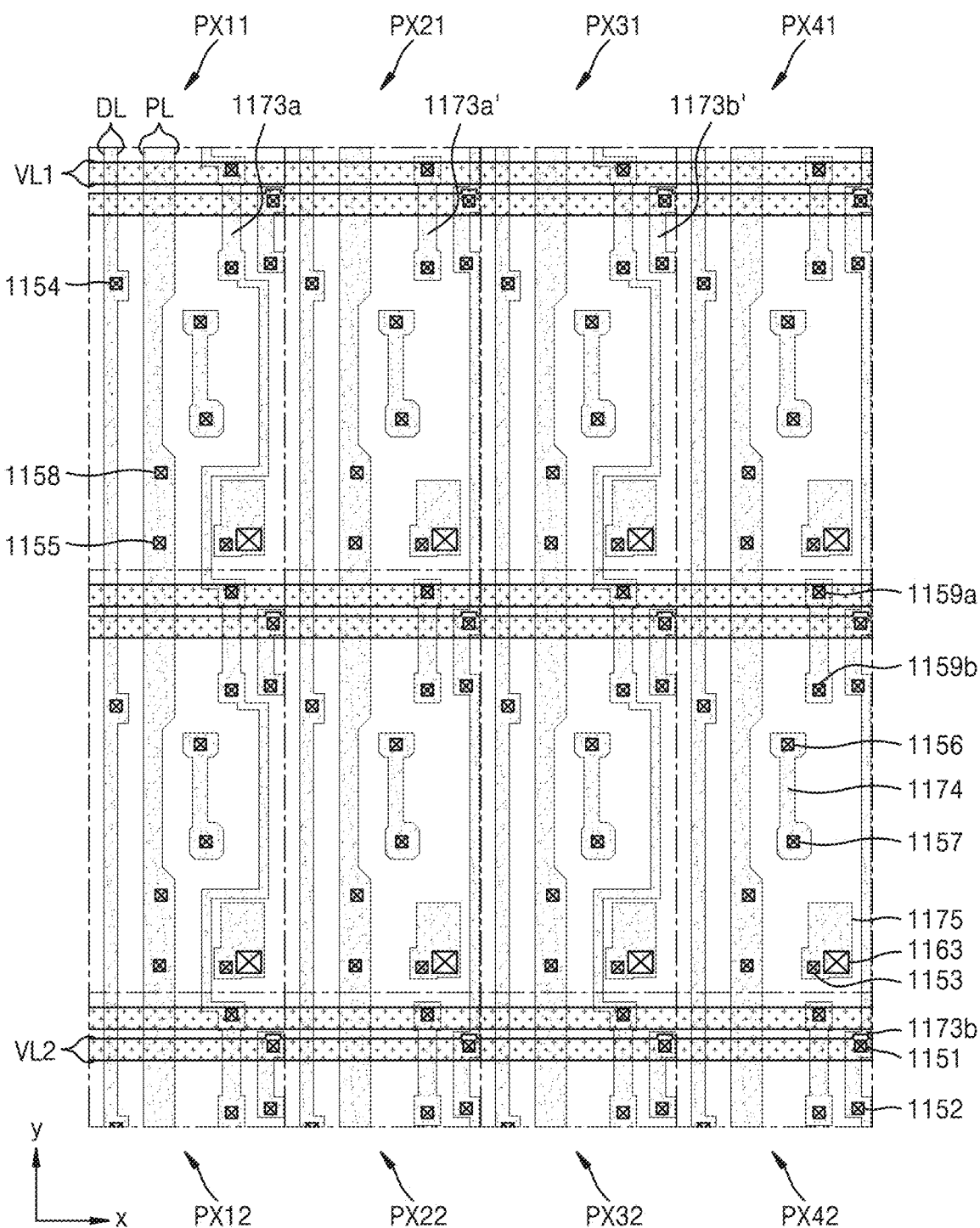
FIG. 9 is a view illustrating an arrangement of first initialization voltage lines, second initialization voltage lines, first initialization connection lines, and second initialization connection lines in a plurality of pixels of a display apparatus according to an alternative embodiment.
Figure 10:
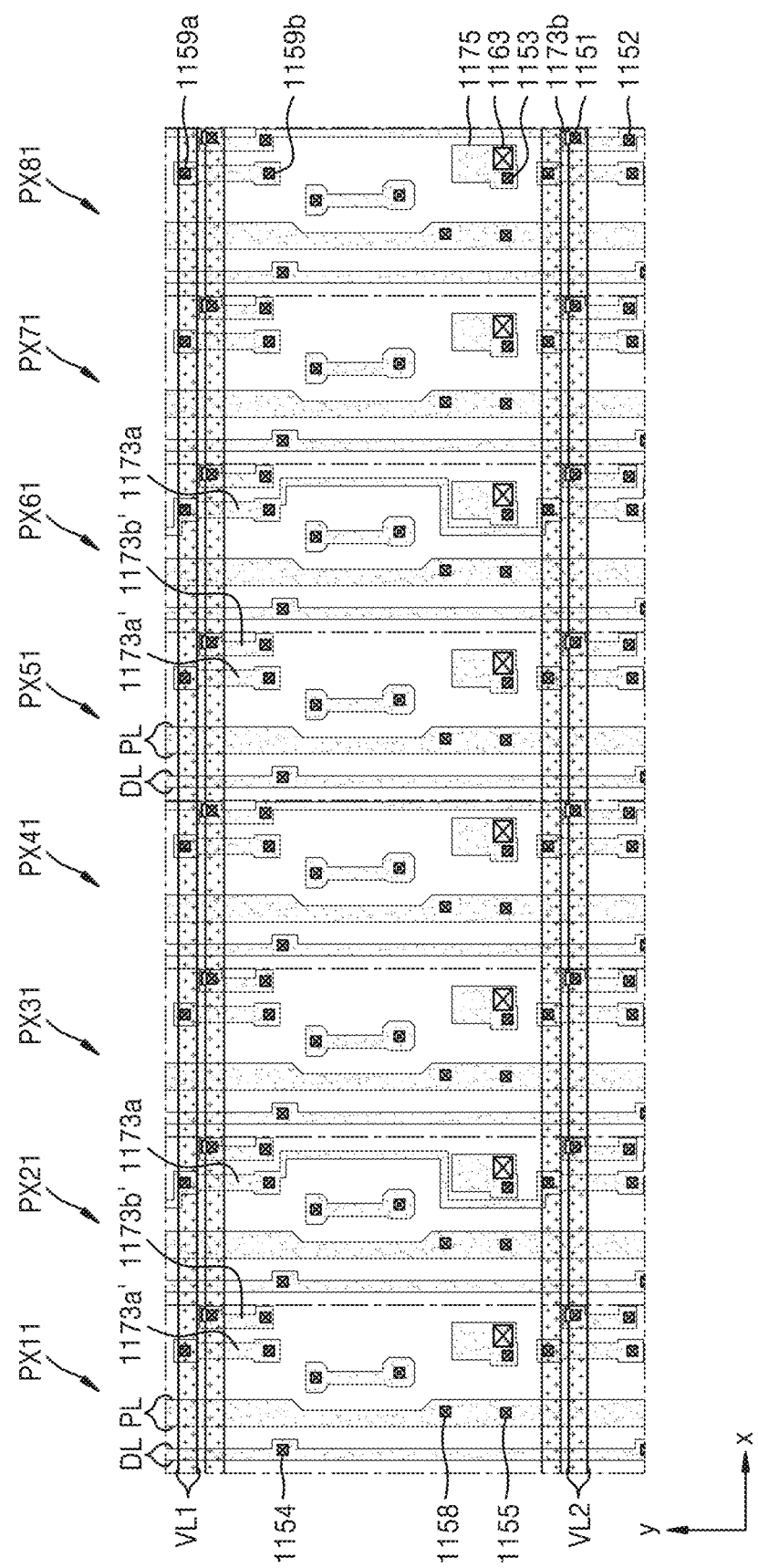
FIG. 10 is a view illustrating an arrangement of first initialization voltage lines, second initialization voltage lines, first initialization connection lines, and second initialization connection lines in a plurality of pixels of a display apparatus according to another alternative embodiment.

FIG. 6 is a view illustrating an arrangement of the first initialization voltage line VL1, the second initialization voltage line VL2, the first initialization connection line 1173a, and the second initialization connection line 1173b of FIG. 3. FIG. 8 is a view illustrating an arrangement of the first initialization voltage lines VL1, the second initialization voltage lines VL2, the first initialization connection lines 1173a, and the second initialization connection lines 1173b in a plurality of pixels. FIG. 9 is a view illustrating an arrangement of first initialization voltage lines, second initialization voltage lines, first initialization connection lines, and second initialization connection lines in a plurality of pixels of a display apparatus according to an alternative embodiment. FIG. 10 is a view illustrating an arrangement of first initialization voltage lines, second initialization voltage lines, first initialization connection lines, and second initialization connection lines in a plurality of pixels of a display apparatus according to another alternative embodiment.

In an embodiment, as shown in FIG. 6, the first initialization voltage lines VL1 and the second initialization voltage lines VL2 extend in the first direction (x-axis direction). The first initialization connection lines 1173a extend in the second direction (y-axis direction) intersecting the first direction (x-axis direction), and electrically connect the first initialization voltage lines VL1. The second initialization connection lines 1173b extend in the second direction (y-axis direction) intersecting the first direction (x-axis direction), and electrically connect the second initialization voltage lines VL2.

The same first initialization voltage Vint1 is desired to be applied to the first initialization voltage lines VL1. However, a voltage drop or the like may occur in the first initialization voltage lines VL1 due to an increase in a size of a display apparatus and/or a high resolution of the display apparatus. In this case, the same first initialization voltage Vint1 may not be applied to the first initialization thin-film transistors T4 of different pixels. In an embodiment of the display apparatus according to the invention, the first initialization connection lines 1173a electrically connect the first initialization voltage lines VL1 arranged in different rows to each other, such that potentials of the initialization voltage lines VL1 may be uniformly maintained at the first initialization voltage Vint1 over an entire display area.

In such an embodiment, the same second initialization voltage Vint2 is desired to be applied to the second initialization voltage lines VL2. However, a voltage drop or the like may occur in the second initialization voltage lines VL2 due to an increase in a size of the display apparatus and/or a high resolution of the display apparatus. In this case, the same second initialization voltage Vint2 may not be applied to the pixel electrodes 210 of different pixels. In an embodiment of the display apparatus according to the invention, the second initialization lines 1173b electrically connect the second initialization voltage lines VL2 arranged in different rows to each other, such that potentials of the second initialization voltage lines VL2 may be uniformly maintained at the second initialization voltage Vint2 over the entire display area.

In an embodiment, the display apparatus may include the substrate 101 as described above, and a through-hole defined through a top surface and a bottom surface of the substrate 101. In such an embodiment, the display apparatus may be provided with a through-hole HL corresponding to the through-hole of the substrate 101 as shown in FIG. 1. In an embodiment where the display apparatus is a component of a smartphone, for example, a camera may be mounted in the through-hole HL of the display apparatus or light incident on a camera disposed below the through-hole HL may pass through the through-hole HL.

In such an embodiment, where the through-hole is through the top surface and the bottom surface of the substrate 101, pixels are located outside the through-hole of the substrate 101. Thin-film transistors included in the pixels and various lines electrically connected to multiple pixels may also be located outside the through-hole. The first initialization voltage line VL1 and the second initialization voltage line VL2 do not pass through the through-hole and have end portions around the through-hole.

In an embodiment where the through-hole is defined through the substrate 101, lengths of the first initialization voltage line VL1 and the second initialization voltage line VL2 in the first direction (x-axis direction) in a portion where the through-hole exists are less than lengths of the first initialization voltage line VL1 and the second initialization voltage line VL2 in the first direction (x-axis direction) in a portion where the through-hole does not exist. As lengths of the first initialization voltage line VL1 and the second initialization voltage line VL2 in a portion where the through-hole exists are different from lengths of the first initialization voltage line VL1 and the second initialization voltage line VL2 in a portion where the through-hole does not exist are different from each other, a degree of a voltage drop occurring in the first initialization voltage line VL1 and the second initialization voltage line VL2 in the portion where the through-hole exists is different from that in the portion where the through-hole does not exist. Accordingly, the first initialization voltage Vint1 and the second initialization voltage Vint2 applied to pixels in rows with the through-hole are different from the first initialization voltage Vint1 and the second initialization voltage Vint2 applied to pixels in rows with no through-hole. IF the first initialization voltage Vint1 and the second initialization voltage Vint2 are different from each other, luminances of pixels may become different from each other even when a same data signal is applied to the pixels.

In an embodiment of the display apparatus according to the invention, the first initialization connection lines 1173a electrically connect the first initialization voltage lines VL1 arranged in different rows to each other, and the second initialization connection lines 1173b electrically connect the second initialization voltage lines VL2 arranged in different rows to each other, such that potentials of the first initialization voltage line VL1 may be uniformly maintained at the first initialization voltage Vint1 in different rows and potentials of the second initialization voltage line VL2 may be uniformly maintained at the second initialization voltage Vint2 in different rows to each other. Accordingly, the display apparatus may display a high-quality image.

In an embodiment, as shown in FIG. 8, the first initialization connection lines 1173a and the second initialization connection lines 1173b pass through each of pixels. In such an embodiment, one first initialization connection line 1173a and one second initialization connection line 1173b extending in the second direction (y-axis direction) pass through a pixel PX11 and a pixel PX12 in a first column, another first initialization connection line 1173a and another second initialization connection line 1173b pass through a pixel PX21 and a pixel PX22 in a second column, another first initialization connection line 1173a and another second initialization connection line 1173b pass through a pixel PX31 and a pixel PX32 in a third column, and another first initialization connection line 1173a and another second initialization connection line 1173b pass through a pixel PX41 and a pixel PX42 in a fourth column. However, the disclosure is not limited thereto.

In one alternative embodiment, for example, as shown in FIG. 9, the first initialization connection lines 1173a may be arranged in one of even-numbered columns and odd-numbered columns of pixels, and the second initialization connection lines 1173b may be arranged in the other of the even-numbered columns and the odd-numbered columns of the pixels. In such an embodiment, as shown in FIG. 9, one first initialization connection line 1173a passes through the pixels PX11 and PX12 of a first column, and another first initialization connection line 1173a passes through the pixels PX31 and PX32 of a third column. In such an embodiment, as shown in FIG. 9, one second initialization connection line 1173b passes through the pixels PX21 and PX22 of a second column, and another second initialization connection line 1173b passes through the pixels PX41 and PX42 of a fourth column. In such an embodiment, the first initialization connection lines 1173a are arranged in odd-numbered columns of the pixels, and the second initialization connection lines 1173b are arranged in even-numbered columns of the pixels.

In an embodiment, the display apparatus may further include a first auxiliary initialization connection line 1173a'. The first auxiliary initialization connection line 1173a' is located in pixels through which the first initialization connection line 1173a does not pass, that is, pixels of even-numbered columns, and is electrically connected to the first initialization voltage line VL1. The first auxiliary initialization connection line 1173a' may be electrically connected to the first initialization thin-film transistor T4 of a corresponding pixel through a contact hole, and may electrically connect the first initialization thin-film transistor T4 to the first initialization voltage line VL1.

In such an embodiment, the display apparatus may further include a second auxiliary initialization connection line 1173b'. The second auxiliary initialization connection line 1173b' is located in pixels through which the second initialization connection line 1173b does not pass, that is, pixels of odd-numbered columns, and is electrically connected to the second initialization voltage line VL2. The second auxiliary initialization connection line 1173b' may be electrically connected to the second initialization thin-film transistor T7 of a corresponding pixel through a contact hole, and may electrically connect the second initialization thin-film transistor T7 to the second initialization voltage line VL2.

In an embodiment of the display apparatus, parasitic capacitance between the first initialization connection line 1173a and the second initialization connection line 1173b may be minimized. In an embodiment, where the first initialization connection line 1173a and the second initialization connection line 1173b are arranged in a same column, the first initialization connection line 1173a and the second initialization connection line 1173b are close to each other, and thus parasitic capacitance may occur between the first initialization connection line 1173a and the second initialization connection line 1173b. In an embodiment of the display apparatus, the first initialization connection line 1173a and the second initialization connection line 1173b are not arranged in a same column but are arranged in different columns, such that parasitic capacitance between the first initialization connection line 1173a and the second initialization connection line 1173b may be minimized.

However, the disclosure is not limited thereto. In one alternative embodiment, for example, the first initialization connection lines 1173a may be arranged in every m columns of the pixels, where m is a natural number greater than 1. In an embodiment, as shown in FIG. 10, the first initialization connection line 1173a is arranged in a second column PX21. In the first direction, another next first initialization connection line 1173a is arranged in a sixth column PX61, while the first initialization connection line 1173a is not arranged in a first, third, fourth, fifth, seventh and eighth columns PX11, PX31, PX41, PX51, PX71 and PX81. In such an embodiment, the first initialization connection lines 1173a may be arranged in every four columns of the pixels.

In such an embodiment, the second initialization connection lines 1173b may be arranged between the first initialization connection lines 1173a. In such an embodiment, the second initialization connection lines 1173b may also be arranged in every m columns of the pixels. In an embodiment, as shown in FIG. 10, the second initialization connection lines 1173b are arranged only in a fourth column PX41 and an eighth column PX81 among the first to eighth columns PX11 to PX 81.

In an embodiment, as described above, the first initialization connection lines 1173a and the second initialization connection lines 1173b may be alternately arranged in the first direction (x-axis direction). In such an embodiment, the first auxiliary initialization connection line 1173a' is located in pixels through which the first initialization connection line 1173a does not pass, and is electrically connected to the first initialization voltage line VL1. The first auxiliary initialization connection line 1173a' may be electrically connected to the first initialization thin-film transistor T4 of a corresponding pixel through a contact hole, and may electrically connect the first initialization thin-film transistor T4 to the first initialization voltage line VL1. In such an embodiment, the second auxiliary initialization connection line 1173b' is located in pixels through which the second initialization connection line 1173b does not pass, and is electrically connected to the second initialization voltage line VL2. The second auxiliary initialization connection line 1173b' may be electrically connected to the second initialization thin-film transistor T7 of a corresponding pixel through a contact hole, and may electrically connect the second initialization thin-film transistor T7 to the second initialization voltage line VL2.

In an embodiment, as described above, the first initialization voltage line VL1 and the second initialization voltage line VL2 are disposed on a second gate insulating film. An interlayer insulating layer is disposed on the first initialization voltage line VL1 and the second initialization voltage line VL2. The first and second initialization connection lines 1173a and 1173b may be disposed on the interlayer insulating layer, along with the data line DL and the power supply voltage line PL. Accordingly, the first and second initialization connection lines 1173a and 1173b may include a same material as a material included in the data line DL and the power supply voltage line PL, and may have the same layer structure as a layer structure of the data line DL and the power supply voltage line PL. In one embodiment, for example, as described above, each of the data line DL, the power supply voltage line PL, and the first and second initialization connection lines 1173a and 1173b may have a multi-layer structure formed of Ti/Al/Ti.

As described above, according to embodiments of the invention as described herein, a display apparatus capable of displaying a high-quality image may be implemented. However, the invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A display apparatus comprising:
   first initialization voltage lines each of which extends in a first direction, wherein the first initialization voltage lines are sequentially arranged in a second direction intersecting the first direction;
   second initialization voltage lines extending in the first direction, wherein the second initialization voltage lines are disconnected from the first initialization voltage lines;
   a first initialization connection line extending in the second direction, wherein the first initialization connection line electrically connects the first initialization voltage lines to each other;
   a second initialization connection line extending in the second direction, wherein the second initialization connection line electrically connects the second initialization voltage lines to each other; and
   pixels electrically connected to the first initialization voltage lines and the second initialization voltage lines,
   wherein a first initialization voltage transmitted through the first initialization voltage lines and a second initialization voltage transmitted through the second initialization voltage lines are respectively applied to two different transistors of each of the pixels,
   wherein a first group of the pixels through which the first initialization connection line passes are electrically connected to a first initialization voltage line by the first initialization connection line, and
   wherein the display apparatus further comprises first auxiliary initialization connection lines located in a second group of the pixels through which the first initialization connection line does not pass, wherein the first auxiliary initialization connection lines are electrically connected to the first initialization voltage line.

2. The display apparatus of claim 1, wherein each of the pixels comprises:
   an organic light-emitting diode;
   a first transistor which controls, in response to a voltage applied to a first node, an amount of current flowing from a second node electrically connected to a power supply voltage line to the organic light-emitting diode;
   a fourth transistor connected between the first node and the first initialization voltage line, wherein the fourth transistor initializes a voltage of a first gate electrode of the first transistor in response to a voltage applied to a fourth gate electrode thereof; and
   a seventh transistor connected between the second initialization voltage line and a third node between the first transistor and the organic light-emitting diode, wherein the seventh transistor initializes a voltage of a pixel electrode of the organic light-emitting diode in response to a voltage applied to a seventh gate electrode thereof.

3. The display apparatus of claim 1, wherein the first initialization connection line passes through each of the pixels arranged in the first direction.

4. The display apparatus of claim 1, wherein
   each of one of even-numbered columns and odd-numbered columns of the pixels includes the first initialization connection line, and
   each of another of the even-numbered columns and the odd-numbered columns of the pixels includes the second initialization connection line.

5. The display apparatus of claim 1, wherein, each of every m columns of the pixels includes the first initialization connection line, wherein m is a natural number greater than 1.

6. The display apparatus of claim 5, wherein the second initialization connection line is arranged between neighboring first initialization connection lines.

7. The display apparatus of claim 5, wherein columns of the pixels include the first initialization connection line and the second initialization connection line which are arranged alternately in the first direction.

8. The display apparatus of claim 1, further comprising:
   data lines extending in the second direction,
   wherein the first initialization connection line and the second initialization connection line are disposed on a layer on which the data lines are disposed.

9. The display apparatus of claim 8, wherein the first initialization connection line and the second initialization connection line comprise a same material as a material included in the data lines.

10. The display apparatus of claim 8, wherein the first initialization voltage lines and the second initialization voltage lines are disposed under the first initialization connection line.

11. The display apparatus of claim 1, further comprising:
power supply voltage lines extending in the second direction,
wherein the first initialization connection line and the second initialization connection line are disposed on a layer on which the power supply voltage lines are disposed.

12. The display apparatus of claim 11, wherein the first initialization connection line and the second initialization connection line comprise a same material as a material included in the power supply voltage lines.

13. The display apparatus of claim 11, wherein the first initialization voltage lines and the second initialization voltage lines are disposed under the first initialization connection line.

14. The display apparatus of claim 1, further comprising:
a substrate, wherein a through-hole are defined through a top surface and a bottom surface of the substrate,
wherein the pixels are located outside the through-hole of the substrate.

15. A display apparatus comprising:
first initialization voltage lines each of which extends in a first direction, wherein the first initialization voltage lines are sequentially arranged in a second direction intersecting the first direction;
second initialization voltage lines extending in the first direction, wherein the second initialization voltage lines are disconnected from the first initialization voltage lines;
a first initialization connection line extending in the second direction, wherein the first initialization connection line electrically connects the first initialization voltage lines to each other;
a second initialization connection line extending in the second direction, wherein the second initialization connection line electrically connects the second initialization voltage lines to each other; and
pixels electrically connected to the first initialization voltage lines and the second initialization voltage lines,
wherein a first initialization voltage transmitted through the first initialization voltage lines and a second initialization voltage transmitted through the second initialization voltage lines are respectively applied to two different transistors of each of the pixels,
wherein a first group of the pixels through which the first initialization connection line passes are electrically connected to a first initialization voltage line by the first initialization connection line,
wherein a third group of the pixels through which the second initialization connection line passes are electrically connected to a second initialization voltage line by the second initialization connection line, and
wherein the display apparatus further comprises second auxiliary initialization connection lines located in a fourth group of the pixels through which the second initialization connection line does not pass, wherein the second auxiliary initialization connection lines are electrically connected to the second initialization voltage line.

16. A display apparatus comprising:
a substrate;
first initialization voltage lines and second initialization voltage lines, which are disposed on the substrate and extending in a first direction, wherein each of the first initialization voltage lines are sequentially arranged in a second direction intersecting the first direction, and the second initialization voltage lines are disconnected from the first initialization voltage lines;
a first initialization connection line disposed on an interlayer insulating layer covering the first initialization voltage lines and the second initialization voltage lines, wherein the first initialization connection line extends in the second direction, and electrically connects the first initialization voltage lines to each other through contact holes defined in the interlayer insulating layer;
a second initialization connection line disposed on the interlayer insulating layer, wherein the second initialization connection line extends in the second direction, and electrically connects the second initialization voltage lines to each other through contact holes defined in the interlayer insulating layer; and
organic light-emitting diodes disposed on a planarization layer covering the first initialization connection line and the second initialization connection line,
wherein a first initialization voltage transmitted thereto through the first initialization voltage lines and a second initialization voltage transmitted thereto through the second initialization voltage lines are respectively applied to two different transistors electrically connected to one of the organic light-emitting diodes, and
wherein a first group of the organic light-emitting diodes through which the first initialization connection line passes are electrically connected to a first initialization voltage line by the first initialization connection line, and
wherein the display apparatus further comprises first auxiliary initialization connection lines located in a second group of the organic light-emitting diodes through which the first initialization connection line does not pass, wherein the first auxiliary initialization connection lines are electrically connected to the first initialization voltage line.

17. The display apparatus of claim 16, wherein the first initialization connection line passes through each of the organic light-emitting diodes arranged in the first direction.

18. The display apparatus of claim 16, wherein
each of one of even-numbered columns and odd-numbered columns of the organic light-emitting diodes includes the first initialization connection line, and
each of another of the even-numbered columns and the odd-numbered columns of the organic light-emitting diodes includes the second initialization connection line.

19. The display apparatus of claim 16, wherein, each of every m columns of the organic light-emitting diodes includes the first initialization connection line, wherein m is a natural number greater than 1.

20. The display apparatus of claim 19, wherein the second initialization connection line is arranged between neighboring first initialization connection lines.

21. The display apparatus of claim 19, wherein columns of the organic light-emitting diodes include the first initialization connection line and the second initialization connection line which are arranged alternately in the first direction.

22. The display apparatus of claim 16, further comprising:
data lines disposed on the interlayer insulating layer and extending in the second direction.

23. The display apparatus of claim 22, wherein the first initialization connection line and the second initialization connection line comprise a same material as a material included in the data lines.

24. The display apparatus of claim 16, further comprising: power supply voltage lines disposed on the interlayer insulating layer and extending in the second direction.

25. The display apparatus of claim 24, wherein the first initialization connection line and the second initialization connection line comprise a same material as a material included in the power supply voltage lines.

26. The display apparatus of claim 16, wherein
a through-hole is defined through a top surface and a bottom surface of the substrate, and
the organic light-emitting diodes are located outside the through-hole of the substrate.

27. A display apparatus comprising:
a substrate;
first initialization voltage lines and second initialization voltage lines, which are disposed on the substrate and extending in a first direction, wherein each of the first initialization voltage lines are sequentially arranged in a second direction intersecting the first direction, and the second initialization voltage lines are disconnected from the first initialization voltage lines;
a first initialization connection line disposed on an interlayer insulating layer covering the first initialization voltage lines and the second initialization voltage lines, wherein the first initialization connection line extends in the second direction, and electrically connects the first initialization voltage lines to each other through contact holes defined in the interlayer insulating layer;
a second initialization connection line disposed on the interlayer insulating layer, wherein the second initialization connection line extends in the second direction, and electrically connects the second initialization voltage lines to each other through contact holes defined in the interlayer insulating layer; and
organic light-emitting diodes disposed on a planarization layer covering the first initialization connection line and the second initialization connection line,
wherein a first initialization voltage transmitted thereto through the first initialization voltage lines and a second initialization voltage transmitted thereto through the second initialization voltage lines are respectively applied to two different transistors electrically connected to one of the organic light-emitting diodes,
wherein a first group of the organic light-emitting diodes through which the first initialization connection line passes are electrically connected to a first initialization voltage line by the first initialization connection line,
wherein a third group of the organic light-emitting diodes through which the second initialization connection line passes are electrically connected to a second initialization voltage line by the second initialization connection line, and
wherein the display apparatus further comprises second auxiliary initialization connection lines located in a fourth group of the organic light-emitting diodes through which the second initialization connection line does not pass, wherein the second auxiliary initialization connection lines are electrically connected to the second initialization voltage line.

* * * * *